United States Patent [19]
Nishi et al.

[11] Patent Number: 5,055,968
[45] Date of Patent: Oct. 8, 1991

[54] THIN ELECTRONIC DEVICE HAVING AN INTEGRATED CIRCUIT CHIP AND A POWER BATTERY AND A METHOD FOR PRODUCING SAME

[75] Inventors: Yoshio Nishi, Kanagawa; Akio Yasuda; Tsunehiro Kashima, both of Tokyo; Takeshi Hori, Kanagawa; Shigetaka Higuchi, Tochigi; Hidetoshi Shimizu, Saitama, all of Japan

[73] Assignee: Sony Corporation, Tokyo, Japan

[21] Appl. No.: 374,744

[22] Filed: Jul. 3, 1989

[30] Foreign Application Priority Data

Jul. 4, 1988 [JP] Japan ................................ 63-164895
Jul. 15, 1988 [JP] Japan ................................ 63-175061

[51] Int. Cl.$^5$ .................... H05K 7/16; G06K 5/00; H01M 4/02; H01M 6/00
[52] U.S. Cl. ........................... 361/395; 429/129; 429/209; 235/380; 29/623.5; 29/600; 29/592.1
[58] Field of Search ............... 364/708; 361/392, 395, 361/330, 380; 283/83; 235/380; 429/7, 124, 127, 129, 162, 209; 29/623.1, 623.2, 623.5, 600, 592.1

[56] References Cited

U.S. PATENT DOCUMENTS

| | | | |
|---|---|---|---|
| 3,648,126 | 3/1972 | Boos et al. | 361/502 |
| 4,394,713 | 7/1983 | Yoshida | 361/433 |
| 4,438,481 | 3/1984 | Phillips et al. | 361/433 |
| 4,777,563 | 10/1988 | Teraoka et al. | 361/395 |

FOREIGN PATENT DOCUMENTS

| | | |
|---|---|---|
| 2595847 | 3/1987 | France . |
| 59-140591 | 8/1984 | Japan . |
| 60-12679 | 1/1985 | Japan . |
| 60-54173 | 3/1985 | Japan . |
| WO85/00523 | 2/1985 | PCT Int'l Appl. . |

Primary Examiner—Leo P. Picard
Assistant Examiner—Bot Lee Ledynh
Attorney, Agent, or Firm—Hill, Van Santen, Steadman & Simpson

[57] ABSTRACT

A method for producing an information card by printing an electroconductive pattern and a first electrode surface of a battery on a first cover sheet, applying a battery activator onto the first electrode surface, resting an electrolyte-impregnated separator onto the first electrode surface, fixing an IC chip to the electroconductive pattern in a predetermined position, printing a second electrode surface of the battery on a second cover sheet, applying a battery activator onto the second electrode surface, and lapping and sticking the first and second cover sheets together and cutting them into a predetermined size.

14 Claims, 4 Drawing Sheets

Surface A | Surface B

THIN ELECTRONIC DEVICE HAVING AN INTEGRATED CIRCUIT CHIP AND A POWER BATTERY AND A METHOD FOR PRODUCING SAME

Field of the Invention

The present invention relates to a thin electronic device having an integrated circuit chip and a power battery for supplying electric power to the integrated circuit chip, as well as a method for producing same.

Description of the Prior Art

Recently, with the tendency to thinning of small-sized electronic devices, there have been developed card-type electronic calculators having an integrated circuit chip between resin sheets and a power battery for supplying electric power to the integrated circuit chip, as well as thin electronic devices such as IC card having a memory function.

Heretofore, a button- or coin-shaped battery has been used in small-sized electronic devices. The thickness of such thin electronic devices is defined to be a maximum of 0.80 mm by JIS. But the use of a button- or coin-shaped battery in a thin electronic device has heretofore made it difficult to fabricate the electronic device within the said rated value of thickness.

Recently, moreover, applications of such IC card have been considered, for example, to a theft detecting system or an automatic goods sorting system, as disclosed in Japanese Patent Publication No. 22997/84. However, since it is necessary to use a large number of IC cards as consumables, there has arisen the necessity of mass-producing IC cards inexpensively.

According to the prior art, the body of a thin electronic device and a battery are produced separately and thereafter the battery is inserted into the body. This method, however, is very troublesome and poor in productivity, leading to increase of cost.

SUMMARY AND OBJECT OF THE INVENTION

Accordingly, it is one object to provide a card-type electronic device and its manufacturing method which overcomes the above-described disadvantage.

It is another object to provide a card-type electronic device and its manufacturing method which enables the device to be thinner than the conventional one.

It is still another object to provide a cardtype electronic device and its manufacturing method which makes it easy and low in cost to manufacture the device.

According to one aspect of the present invention there is provided a method for producing an information card, comprising:

a first printing step of forming by printing an electroconductive pattern and a first electrode surface of a battery on a first cover sheet;

a first application step of applying a battery activator onto the first electrode surface;

a resting step of resting an electrolyte-impregnated separator onto the first electrode surface;

a fixing step of fixing an IC chip to the electroconductive pattern in a predetermined position;

a second printing step of forming by printing a second electrode surface of the battery on a second cover sheet;

a second application step of applying a battery activator onto the second electrode surface; and a cutting step of lapping and sticking the first and the second cover sheet together and cutting them into a predetermined size.

According to another aspect of the present invention there is provided a method for producing an information card, comprising the steps of:

printing an electroconductive pattern and first and second electrode surfaces of a battery onto integrally-formed first and second cover sheet portions;

applying an anodic active material and a cathodic active material onto the first and second electrode surfaces, respectively;

fixing an IC chip to the electroconductive pattern in a predetermined position;

resting an electrolyte-impregnated separator onto one of the first and second electrode surfaces; and folding the first and second cover sheet portions so as to be superposed one upon the other and cutting them into a predetermined size.

According to a further aspect of the present invention there is provided a thin electronic device including:

a first cover sheet with a first electrode surface of a battery formed thereon;

a second cover sheet with a second electrode surface of the battery formed thereon;

an anodic active material applied onto the first electrode surface;

a cathodic active material applied onto the second electrode surface;

a separator impregnated with electrolyte;

a circuit member positioned between the first and the second cover sheet and operated by the battery; and a connecting conductor formed on the first and the second cover sheet to connect the first and the second electrode surface with the circuit member, the anodic active material and the cathodic active material being opposed to each other through the separator, the first and the second cover sheet being integrally laminated together to hold the circuit member.

DESCRIPTION OF THE PREFERRED EMBODIMENTS

Figure 1:
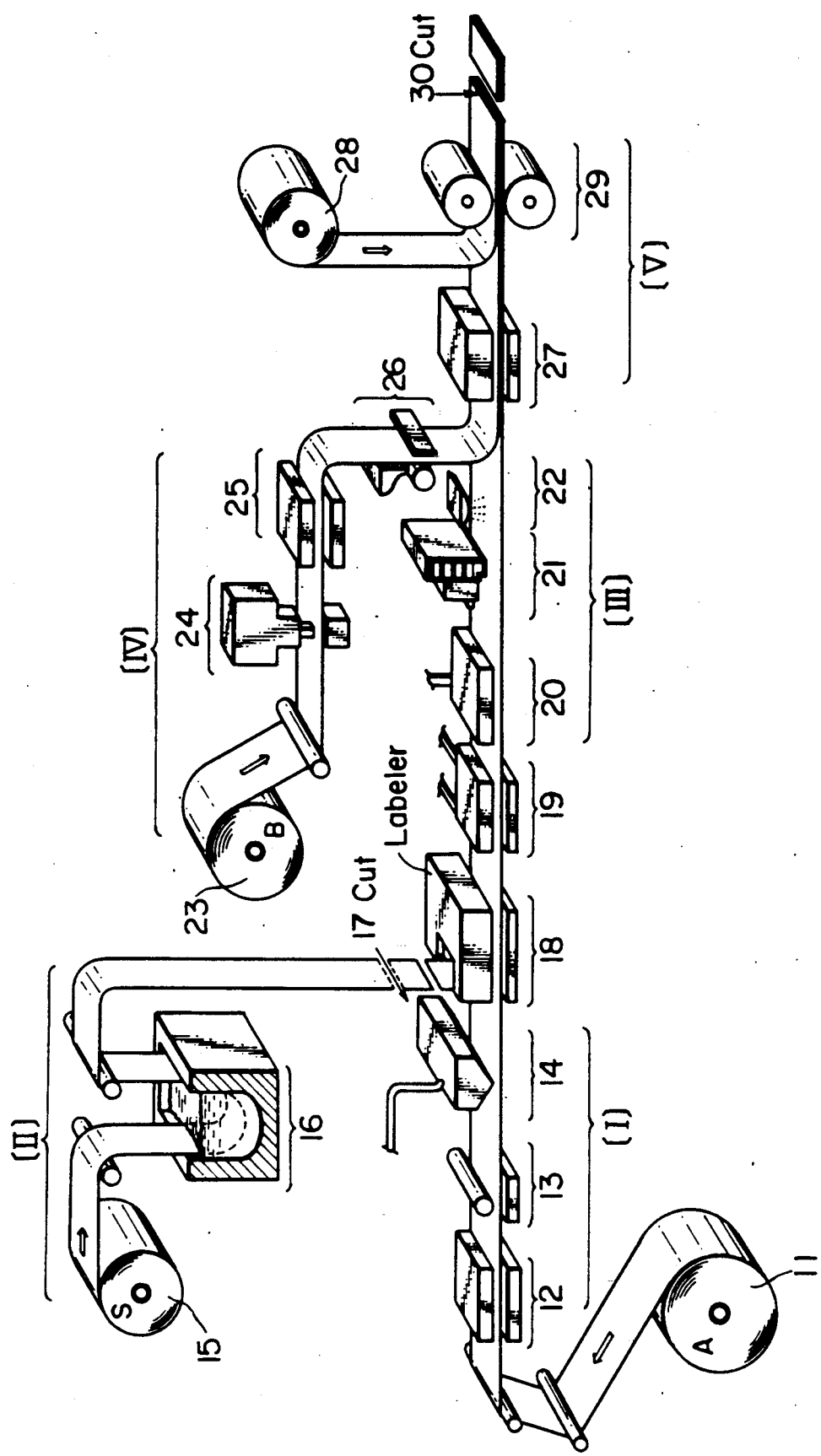
FIG. 1 is a schematic explanatory view of a method for producing an information card according to the present invention.

FIG. 1 is a schematic view for explaining the method for producing an information card according to the present invention. An example of a concrete structure of the information card thereby produced is shown in a plan view of FIG. 2(a), a sectional view of FIG. 2(b) and a separated side view of FIG. 2(c).

Patterns on the information card surface in the manufacturing steps of [I] to [V] are shown in FIG. 3.

Figure 2A:
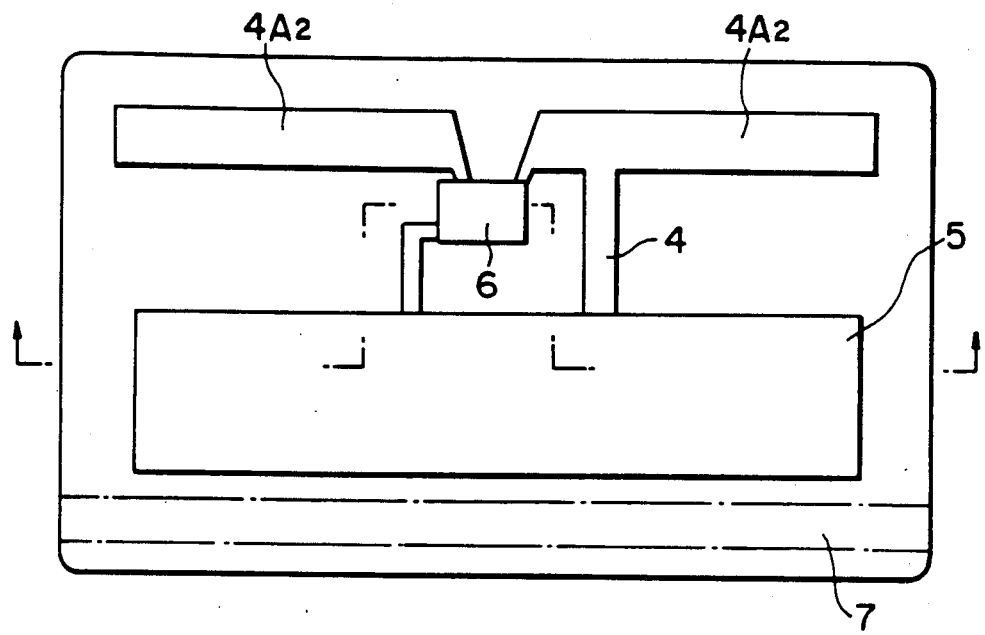
FIGS. 2(a), 2(b) and 2(c) are a plan view, a sectional side view and a separated side view, respectively, of the information card.
Figure 2B:
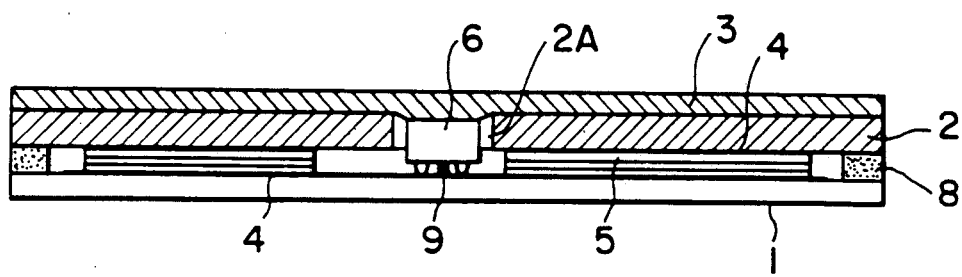

For example, as shown in the plan view of FIG. 2(a) and sectional view of FIG. 2(b), the information card comprises a back-side cover sheet (hereinafter referred to also as the first cover sheet) 1 and a surface-side cover sheet (also as the second cover sheet hereinafter) 2. In the card of this embodiment, an adhesive sheet 3 is stuck on the upper surface of the surface-side cover sheet 2 to display the kind of card.

Between the first and the second cover sheet there are provided an electroconductive pattern 4, a flat battery 5 and an IC chip 6, and for thinning purpose, a hole 2A is formed in the second cover sheet 2 so that the IC chip 6 is fitted therein when the first and the second cover sheet are lapped together.

Part of the electroconductive pattern 4, which is connected to the IC chip 6, serves as a pair of antennas (dipole antennas) $4A_2$ which change in characteristic impedance according to the data stored in the IC memory, while wider area portions thereof serve as positive and negative electrode surfaces $4A_1$, $4B_1$.

Figure 2C:
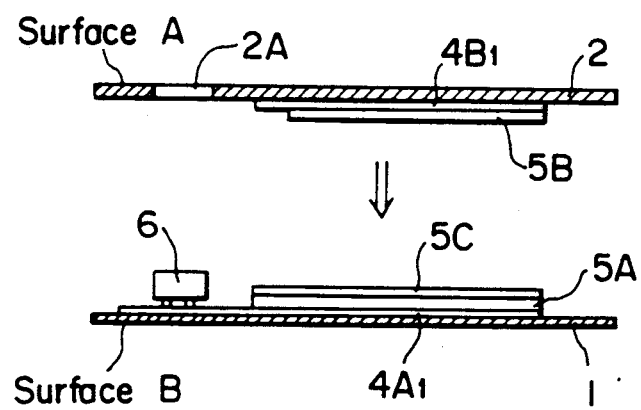

As best seen in FIG. 2(c), the battery 5 is formed by applying active materials 5A and 5B (Zn, $MnO_2$) of the battery in the state of gel onto the electrode surfaces $4A_1$ and $4B_1$ which are formed by the printing technique or the like on the first and second cover sheets 1, 2, and then sandwiching an electrolyte-impregnated separator 5C in between the cover sheets 1 and 2.

On the outer surface of the first cover sheet 1 there may be formed a magnetic film 7 according to ISO standards as in ordinary magnetic cards.

An embodiment of the present invention for producing such information card as mentioned above will be described hereinunder with reference to FIG. 1.

In FIG. 1, the numeral 11 denotes a band-like cover sheet (A) formed of polyethylene terephthalate (PET) or polypropylene (P.P) and having a thickness of about 50 μm. The cover 11 is drawn out by a roll in the illustrated direction and fed to a magnetic stripe printing section, wherein a magnetic film area according to ISO standards is formed on the lower surface of the cover sheet 11(A).

Numeral 13 denotes a screen printing section (A) for forming a wiring pattern on the upper surface of the cover sheet 11. In the screen printing section 13, such a wiring pattern as shown in FIG. 3(a) is printed to the cover sheet 11, using an electroconductive coating material such as, for example, pasty carbon, copper which has been made pasty, or pasty mercury.

The portion $4A_1$ of this wiring pattern represents an electrode surface [$4A_1$ in FIG. 2(c)] serving as a negative (−) pole of the battery in the information card, while the portion $4A_2$ represents an electroconductive surface serving as antenna.

Figure 3A:
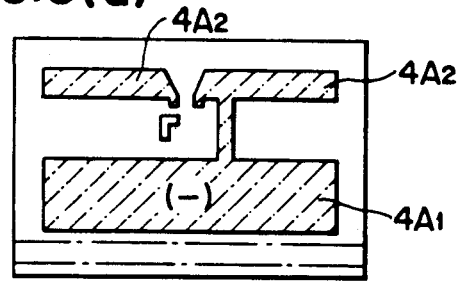
FIGS. 3(a) to (g) are plan views of the information card in the course of manufacturing steps.
Figure 3E:
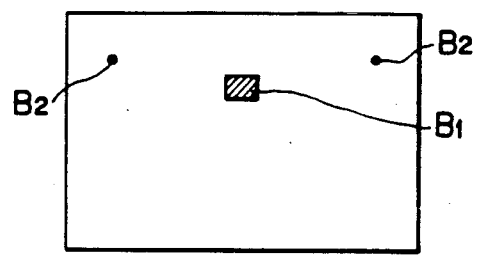
Figure 3B:
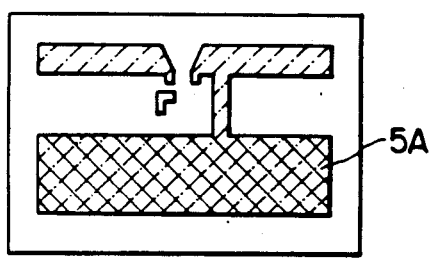

Numeral 14 denotes an active material applying section for applying zinc (Zn) gel acting as an activator in the battery to the portion $4A_1$ which serves as an electrode surface as in FIG. 3(a), and in the portion indicated by rightwards oblique lines in FIG. 3(b), Zn gel 5A is applied onto the upper surface of the wiring pattern $4A_1$ in a thickness of about 50 μm.

Numeral 15 denotes a separator sheet in the battery which sheet is formed by kraft paper for example. The separator sheet 15, which is rolled, passes through an electrolyte impregnating section 16, whereby it is impregnated with electrolyte, e.g. $ZnCl_2$.

Figure 3F:
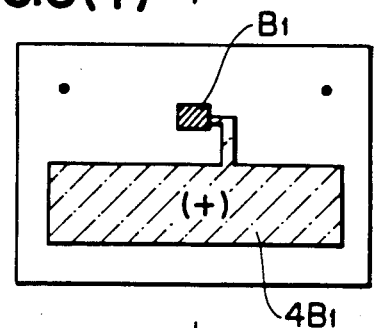
Figure 3C:
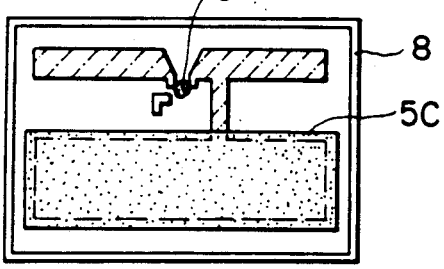

The thus electrolyte-impregnated separator 5C is cut into a predetermined size in a cutting section 17, then in a separator sticking section 18 it is placed on the electrode surface $4A_1$ of the wiring pattern, as shown in FIG. 3(c).

By the above continuous steps there is constituted the first cover sheet 1 (surface A).

Then, in a mask mounting section 19, as shown in FIG. 3(c), a frame 8 is stuck to the first cover sheet having the surface A so as to slightly raise the peripheral portion of the wiring pattern. Further, in a hardener applying section 20, a small amount of a hardener 9 is applied to the first cover sheet in a position in which the IC chip 6 is to be fixed.

At this time, a polyester-based hot melt adhesive is screen-printed to the outer peripheral portion of the electrode surface $4A_1$.

Figure 4:
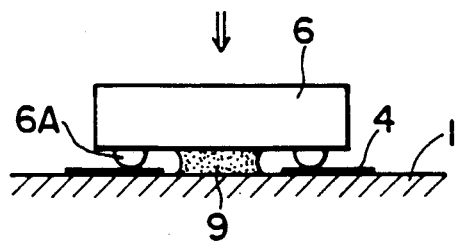
FIG. 4 is an enlarged view of an IC chip.

Numeral 21 denotes an IC chip packaging machine. IC chips 6 extruded one by one from the IC chip packaging machine 21 are each pushed against the wiring pattern in a predetermined position. For example, as shown in the enlarged view of FIG. 4, lead terminals of the IC chip 6 are formed as bumps 6A, which are pushed against the wiring pattern 4 in predetermined positions. Then, infrared ray is radiated from an infrared ray radiating section 22 to the pre-applied hardener 9 to thereby fix the first cover sheet 1 and the IC chip 6 together.

Since the hardener 9 hardens and contracts upon radiation of infrared ray, the bumps 6A and the wiring pattern 4 are held in a good electrically conducted state.

Figure 3G:
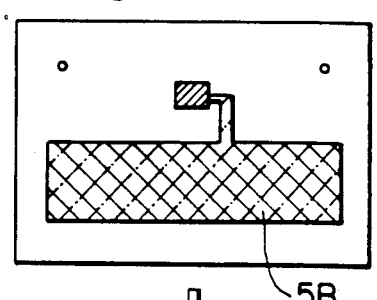
Figure 3D:
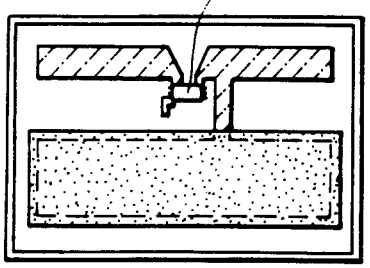

The cover sheet of the surface A shown in FIG. 3(d) with the IC chip 6, battery active material and separator formed thereon is then lapped with a cover sheet 23 which serves as the second cover sheet 2 and both are stuck together.

More specifically, the cover sheet (B) (PET or P.P) 23, which is rolled, is drawn out in the arrowed direction and fed to a puncher 24, in which there are formed an aperture $B_1$ for IC chip and apertures $B_2$ for antenna contact, as shown in FIG. 3(e).

The aperture $B_1$ is formed in the position corresponding to the mounted position of the IC chip fixed to the cover sheet of the surface A as mentioned above, while the apertures $B_2$ are formed in the positions corresponding to the antenna areas ($4A_2$, $4A_2$).

The cover sheet (B) thus formed with the apertures $B_1$ and $B_2$ is then fed to a screen printing section (B) 25, in which an electroconductive wiring pattern such as that shown in FIG. 3(f) is printed to the cover sheet.

The greater part of the wiring pattern is in corresponding relation to the electrode surface ($4A_1$) of the surface A, forming a positive (+) electrode surface [$4B_1$ in FIG. 2(c)] of the battery.

Then, in an active material applying section (B) 26, for example zinc oxide 5B ($ZnO_2$) which is in the state of gel is applied as a depolarizer to the electrode surface of the surface B in a thickness of about 50 μm to form the cover sheet of FIG. 3(g).

Preferably, at this time, a polyester-based hot melt adhesive is screen-printed also to the outer peripheral portion of the electrode surface ($4B_1$).

This cover sheet (B) of the surface B and the foregoing cover sheet (A) of the surface A are lapped together and united, at station 27, for example by heat-treating the two at 130° C. for about 15 minutes or by an ultrasonic fusion-bonding technique. At this time, the battery electrode surfaces are completely sealed by the hot melt adhesive.

In this case, it goes without saying that both sheets should be lapped together and united for registration between the pattern on the surface A and that on the surface B and in such a position as to permit the IC chip 6 to be embedded in the aperture $B_1$.

Numeral 28 denotes an adhesive tape, which is stuck, at station, to cover the apertures $B_1$ and $B_2$ of the cover sheet (B) which has been rendered integral with the other cover sheet by fusion-bonding for example.

Lastly, the integral sheet member is cut into a predetermined size (e.g. a size according to ISO standards) by means of a cutter 30 to obtain such information card as shown in FIG. 2.

Although in the information card manufacturing method described above the cover sheets (11, 23) of the surfaces A and B which constitute the information card are fed separately, there may be used cover sheets (A) and (B) which are in a united state from the beginning.

Figure 5A:
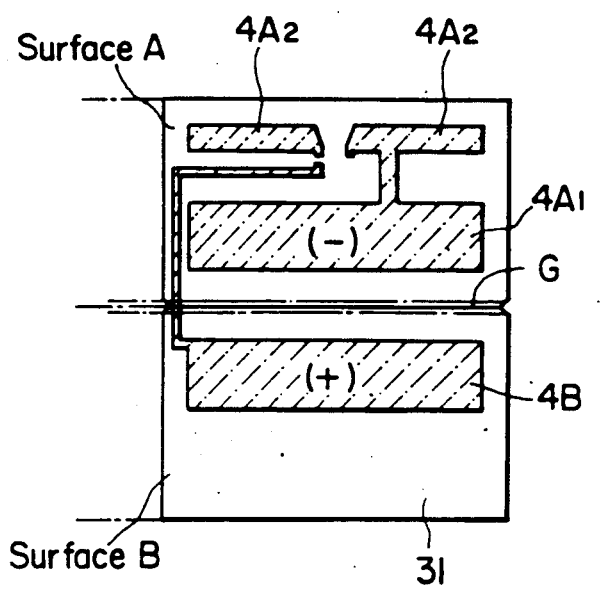
FIGS. 5(a) to (c) are process charts showing another embodiment of the present invention.

More specifically, as shown in FIG. 5(a), a cover sheet 31 serving as both surfaces A and B has a groove G which permits folding upwards and downwards with respect to a central line. The surface of the cover sheet 31 is divided into surfaces A and B on both sides of the groove G, and wiring patterns 4A and 4B are printed on the surfaces A and B, respectively, using an electroconductive coating material.

As previously noted, Zn gel is applied to an electrode surface $4A_1$ of the wiring pattern 4A, while $ZnO_2$ gel is applied to an electrode surface $4B_1$ of the surface B. And as shown in FIG. 5(b), a separator 5C impregnated with electrolyte is put on the surface B, and apertures $B_1$ and $B_2$ are formed on the same surface.

Figure 5B:
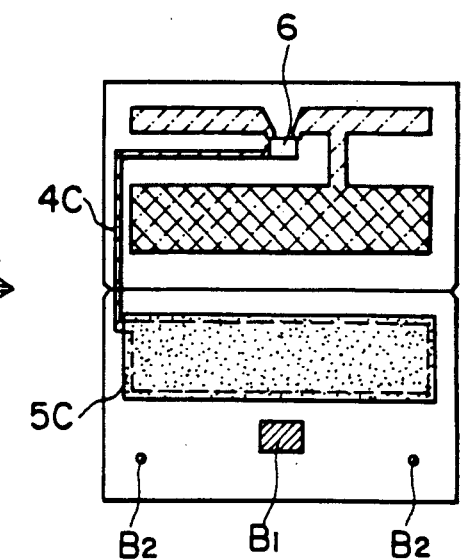
Figure 5C:
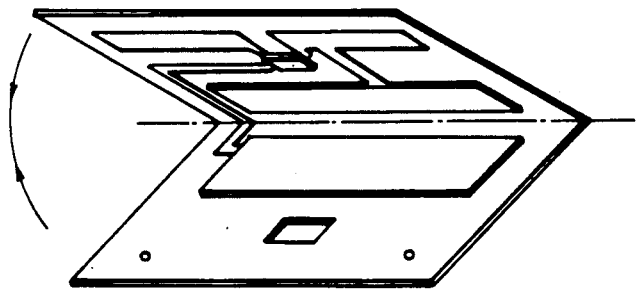

Further, an IC chip 6 is fixed to the wiring pattern on the surface A using a hardener as noted previously and there is formed such cover sheet as shown in FIG. 5(b). The wiring patterns on the surfaces A and B of this cover sheet are connected together through an electroconductive path 4C extending across the groove G.

The cover sheet of FIG. 3(b) is folded along the groove G as shown in FIG. 3(c), to superpose the surfaces A and B together to form an information card.

Also in this second embodiment there are used most of the devices used in the manufacturing method illustrated in FIG. 1. The second embodiment is advantageous in that the screen printing sections 13, 25 and the active material applying sections 14, 26 can be gathered at one place, thus permitting further simplification of the manufacturing system.

What is claimed is:

1. A method for producing an information card, comprising:
    a first printing step of forming by printing an electroconductive pattern and a first electrode surface of a battery on a first cover sheet;
    a first application step of applying a battery activator onto said first electrode surface;
    a resting step of resting an electrolyte-impregnated separator onto said first electrode surface;
    a fixing step of fixing an IC chip to said electroconductive pattern in a predetermined position;
    a second printing step of forming by printing a second electrode surface of said battery on a second cover sheet;
    a second application step of applying a battery activator onto said second electrode surface; and
    a cutting step of lapping and sticking said first and said second cover sheets together and cutting them into a predetermined size.

2. A method according to claim 1, wherein an antenna portion and an electrode portion for said IC chip are formed as the electroconductive pattern in said first printing step.

3. A method according to claim 1, wherein paste of one of anodic and cathodic active materials is printed onto the first electrode surface in said first application step, and paste of the other active material is printed onto the second electrode surface in said second application step.

4. A method according to claim 1, wherein said resting step comprises using kraft paper as said separator and impregnating said kraft paper with $ZnCl_2$ as electrolyte.

5. A method according to claim 2, wherein said electroconductive pattern and said first and second electrode surfaces are formed using carbon paste in said first and second printing steps.

6. A method according to claim 2, wherein the antenna portion of said electroconductive pattern constitutes a dipole antenna.

7. A method for producing an information card, comprising the steps of:
    printing an electroconductive pattern and first and second electrode surfaces of a battery onto integrally-formed first and second cover sheet portions;
    applying an anodic active material and a cathodic active material onto said first and second electrode surfaces, respectively;
    fixing an IC chip to said electroconductive pattern in a predetermined position;
    resting an electrolyte-impregnated separator onto one of said first and second electrode surfaces; and
    folding said first and second cover sheet portions so as to be superposed one upon the other and cutting them into a predetermined size.

8. A thin electronic device including:
    a first cover sheet with a first electrode surface of a battery formed thereon;
    a second cover sheet with a second electrode surface of the battery formed thereon;
    an anodic active material applied onto said first electrode surface;
    a cathodic active material applied onto said second electrode surface;
    a separator impregnated with electrolyte;
    a circuit member positioned between said first and said second cover sheets and operated by said battery; and
    a connecting conductor formed on said first and said second cover sheets to connect said first and second electrode surfaces with said circuit member,
    said anodic active material and said cathodic active material being opposed to each other through the separator, said first and said second cover sheets being integrally laminated together without an intermediate layer to hold said circuit member.

9. A thin electronic device according to claim 8, wherein said first or said second electrode surface and said connecting conductor are formed integrally, and part of said connecting conductor is constituted as an antenna.

10. A thin electronic device according to claim 9, wherein said first, second electrode surfaces and said connecting conductor are formed by screenprinting carbon paste onto said first and said second cover sheets.

11. A thin electronic device according to claim 8, wherein said anodic active material is formed by screen-printing $MnO_2$ paste onto said first electrode surface.

12. A thin electronic device according to claim 8, wherein said cathodic active material is formed by screen-printing Zn paste onto said second electrode surface.

13. A thin electronic device according to claim 11 or claim 12, wherein the thickness of said anodic active material applied and that of said cathodic active material applied are in the range of 20 to 70 $\mu$m.

14. A thin electronic device according to claim 8, having a thickness not larger than 1 mm.

* * * * *